United States Patent
Li et al.

(10) Patent No.: US 12,490,464 B2
(45) Date of Patent: Dec. 2, 2025

(54) SOURCE/DRAIN FEATURES FOR MULTI-GATE DEVICE AND METHOD OF FABRICATING THEREOF

(71) Applicant: Taiwan Semiconductor Manufacturing Company, Ltd., Hsin-Chu (TW)

(72) Inventors: Shang-Rong Li, Hsinchu (TW); Shih-Hao Lin, Hsinchu (TW); Chih-Hsiang Huang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 629 days.

(21) Appl. No.: 17/750,017

(22) Filed: May 20, 2022

(65) Prior Publication Data
US 2023/0378298 A1    Nov. 23, 2023

(51) Int. Cl.
| | | |
|---|---|---|
| H10D 30/67 | (2025.01) | |
| H10D 30/01 | (2025.01) | |
| H10D 64/01 | (2025.01) | |
| H10D 84/01 | (2025.01) | |
| H10D 84/03 | (2025.01) | |

(52) U.S. Cl.
CPC ....... *H10D 30/6735* (2025.01); *H10D 30/031* (2025.01); *H10D 30/6713* (2025.01); *H10D 30/6757* (2025.01); *H10D 64/017* (2025.01); *H10D 64/018* (2025.01); *H10D 84/0128* (2025.01); *H10D 84/013* (2025.01); *H10D 84/038* (2025.01)

(58) Field of Classification Search
CPC ......... H01L 29/42392; H01L 29/66545; H01L 29/66553; H01L 29/66742; H01L 29/78618; H01L 29/78696; H01L 21/823412; H01L 21/823418; H10D 30/6735; H10D 30/6757; H10D 30/6713; H10D 30/031; H10D 84/013; H10D 84/0128; H10D 84/038; H10D 64/018; H10D 64/017
USPC ....................................................... 257/152
See application file for complete search history.

(56) References Cited

U.S. PATENT DOCUMENTS

| | | |
|---|---|---|
| 10,170,638 B1 | 1/2019 | Reznicek |
| 2021/0202697 A1 | 7/2021 | Young |
| 2021/0351303 A1 | 11/2021 | Ju |

(Continued)

FOREIGN PATENT DOCUMENTS

| | | |
|---|---|---|
| TW | 201914018 A | 4/2019 |
| TW | 202147456 A | 12/2021 |
| TW | 202201548 A | 1/2022 |

*Primary Examiner* — Tu-Tu V Ho
(74) *Attorney, Agent, or Firm* — HAYNES AND BOONE, LLP

(57) ABSTRACT

A semiconductor device and a method of forming the same are provided. In an embodiment, an exemplary semiconductor device includes a vertical stack of channel members disposed over a substrate, a gate structure wrapping around each channel member of the vertical stack of channel members, and a source/drain feature disposed over the substrate and coupled to the vertical stack of channel members, the source/drain feature comprising an undoped bottom layer and a doped upper layer, where a part of the undoped bottom layer of the source/drain feature is disposed directly under the gate structure.

20 Claims, 14 Drawing Sheets

(56) References Cited

U.S. PATENT DOCUMENTS

2022/0122893 A1* 4/2022 Lai ..................... H01L 29/0653
2022/0157969 A1* 5/2022 Yin ................... H01L 29/66545

* cited by examiner

SOURCE/DRAIN FEATURES FOR MULTI-GATE DEVICE AND METHOD OF FABRICATING THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices are introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor. While existing MBC transistors may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
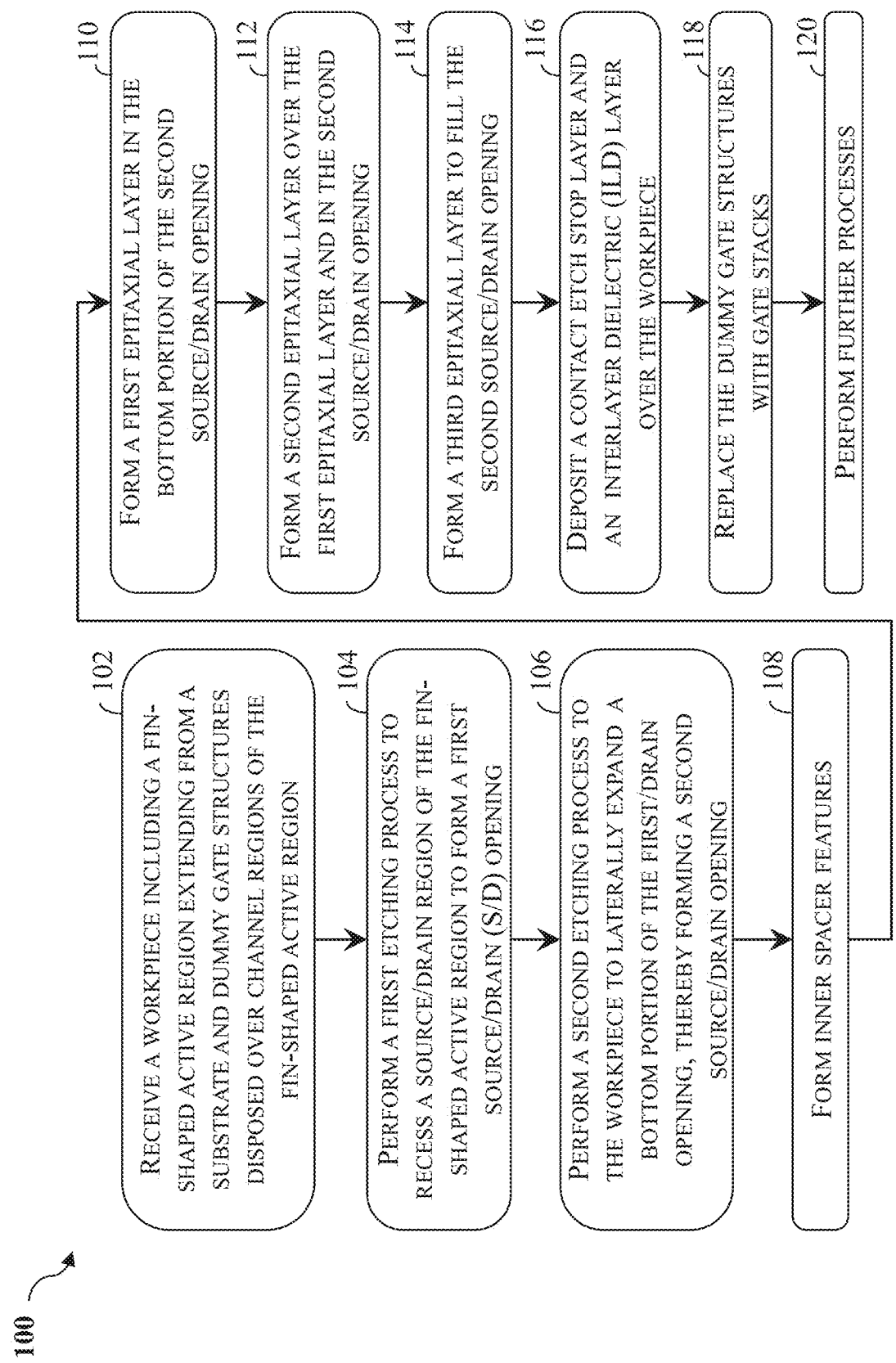
FIG. 1 illustrates a flow chart of a method for forming a semiconductor device having a source/drain feature with a modified profile, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Formation of an MBC transistor includes formation of a stack that includes a number of channel layers interleaved by a number of sacrificial layers over a substrate, where the sacrificial layers may be selectively removed to release the channel layers as channel members by a subsequent etching process. The stack and a top portion of the substrate are patterned to form active regions. The patterned top portion of the substrate may be referred to as a mesa structure. A gate structure that includes a dielectric layer and a conductive layer is then formed to wrap around and over each of the channel members. However, in some instances, MBC transistors may suffer current leakage near the mesa structure. For example, the gate structure not only wraps around the channel members disposed over the substrate, but also directly engages the mesa structure under those channel members, leading to strong leakage current flowing into the substrate.

The present disclosure provides a method for forming source/drain features with a modified profile. In an exemplary method, after forming a fin-shaped active region (including the mesa structure) and forming a dummy gate structure over a channel region of the fin-shaped active region, a first etching process is performed to recess a source/drain region of the fin-shaped active region to form a source/drain opening, and a second etching process is then followed to laterally recess the mesa structure and enlarge a bottom portion of the source/drain opening, thereby forming an enlarged source/drain opening. The enlarged source/drain opening extends laterally into the mesa structure under the channel region. A source/drain feature is then formed to fill the enlarged source/drain opening. More specifically, the source/drain feature includes an undoped semiconductor layer filling a bottom portion of the enlarged source/drain opening and one or more doped semiconductor layers filling a rest of the enlarged source/drain opening, where a portion of the undoped semiconductor layer is disposed directly under the dummy gate structure. The dummy gate structure may be then replaced by a functional gate stack. By modifying the mesa structure's profile and forming the source/drain feature having a corresponding modified profile, the leakage current through the mesa structure may be advantageously reduced, providing a better device performance.

The various aspects of the present disclosure will now be described in more detail with reference to the figures. In that regard, FIG. 1 is a flowchart illustrating method 100 of forming a semiconductor device according to embodiments of the present disclosure. Method 100 is described below in conjunction with FIGS. 2-13, which are fragmentary cross-sectional views or fragmentary top views of a workpiece 200 at different stages of fabrication according to embodiments of method 100. Method 100 is merely an example and is not intended to limit the present disclosure to what is explicitly illustrated therein. Additional steps may be provided before, during, and/or after the method 100, and some steps described can be replaced, eliminated, or moved around for additional embodiments of the method. Not all steps are described herein in detail for reasons of simplicity. Because the workpiece 200 will be fabricated into a semiconductor device 200 upon conclusion of the fabrication processes, the workpiece 200 may be referred to as the semiconductor device 200 as the context requires. For avoidance of doubts, the X, Y and Z directions in FIGS. 2-13 are perpendicular to one another and are used consistently throughout FIGS. 2-13. FIG. 14 illustrates a circuit schematic of an exemplary SRAM cell according to various aspects of the present disclosure. Throughout the present disclosure, like reference numerals denote like features unless otherwise excepted.

Figure 2:
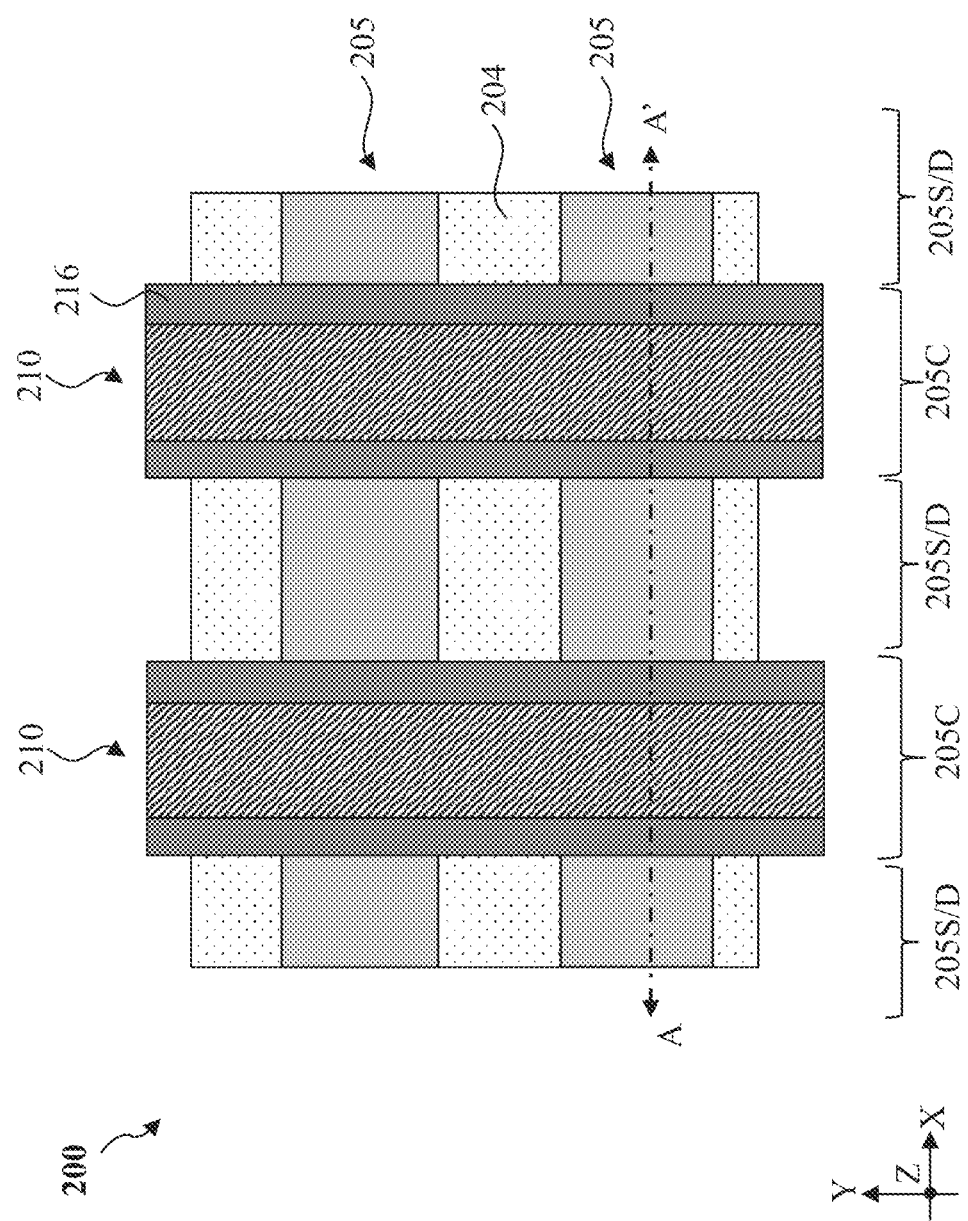
FIG. 2 depicts a fragmentary top view of an exemplary workpiece to undergo various stages of operations in the method of FIG. 1, according to various aspects of the present disclosure.
Figure 3:
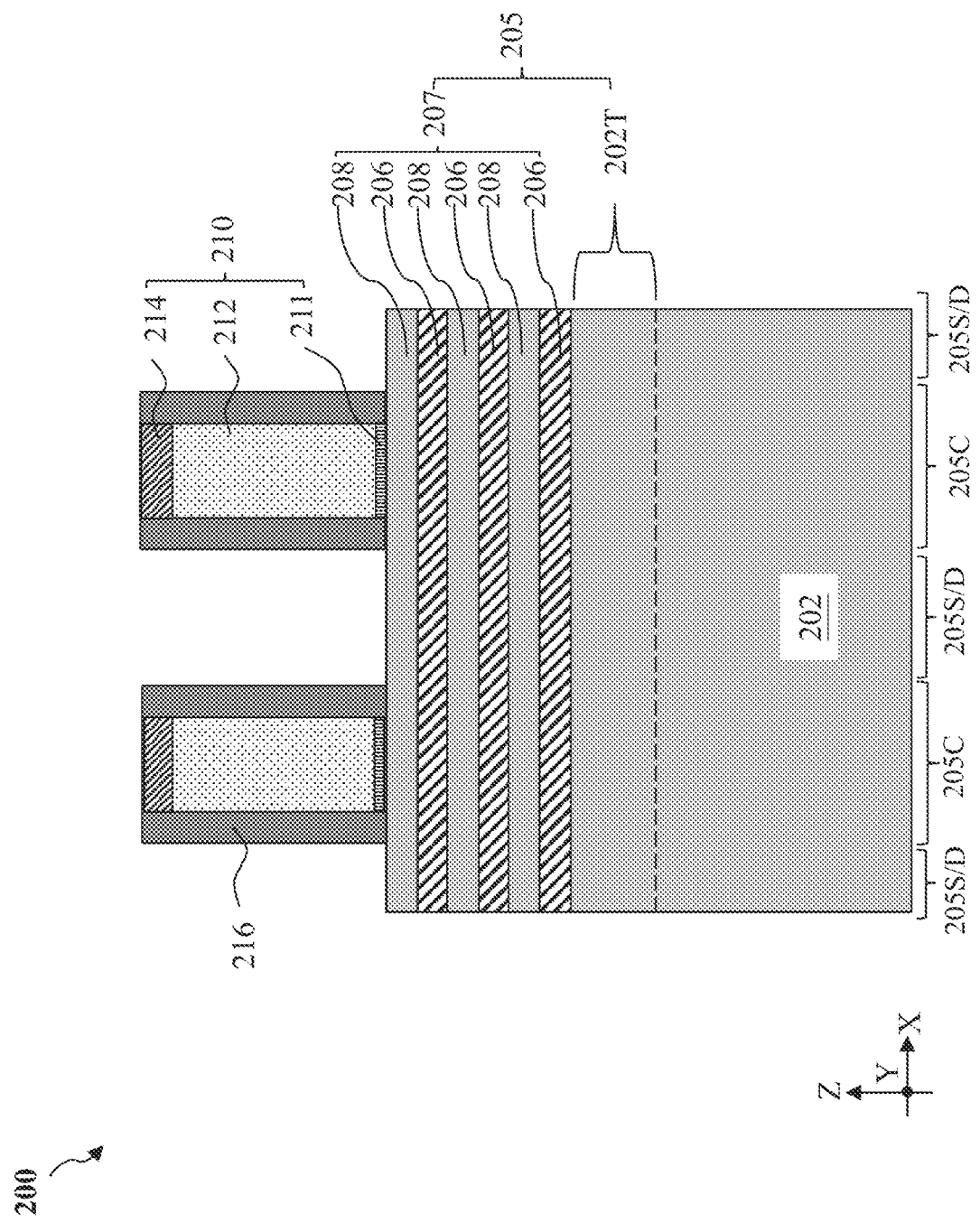
FIGS. 3, 4, 5, 6, 7, 9, 10, 11 and 13 illustrate fragmentary cross-sectional views of the workpiece taken along line A-A' as shown in FIG. 2 during various fabrication stages in the method of FIG. 1, according to various aspects of the present disclosure.

Referring to FIGS. 1, 2 and 3, method 100 includes a block 102 where a workpiece 200 is received. The workpiece 200 may be an intermediate structure fabricated during processing of an Integrated Circuit (IC), or a portion thereof, that may comprise static random-access memory (SRAM) and/or other logic circuits, passive components such as resistors, capacitors, and inductors, and active components such as transistors, and/or other memory cells. The present disclosure is not limited to any particular number of devices or device regions, or to any particular device configurations, unless otherwise claimed. For example, although the workpiece 200 as illustrated is a three-dimensional GAA device, the concepts of the present disclosure may also apply to planar FET devices or FinFET devices.

As shown in FIG. 3, the workpiece 200 includes a substrate 202. In an embodiment, the substrate 202 is a bulk silicon substrate (i.e., including bulk single-crystalline silicon). The substrate 202 may include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof, or other suitable materials. In some alternative embodiments, the substrate 202 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

The workpiece 200 includes a fin-shaped active region 205 disposed over the substrate 202. The fin-shaped active region 205 extends lengthwise along the X direction and is divided into channel regions 205C overlapped by dummy gate structures 210 (to be described below) and source/drain regions 205S/D not overlapped by dummy gate structures 210. Source/drain region(s) may refer to a source or a drain, individually or collectively dependent upon the context. The numbers of fin-shaped active regions 205, channel regions 205C, and source/drain regions 205S shown in FIG. 2 are for illustration purpose only and should not be construed as limiting the scope of the present disclosure. The fin-shaped active region 205 may be formed from a top portion 202T of the substrate 202 and a vertical stack 207 of alternating semiconductor layers 206 and 208 using a combination of lithography and etch steps. That is, the fin-shaped active region 205 includes a patterned vertical stack 207 and a patterned top portion 202T of the substrate 202 thereunder. The patterned top portion 202T of the substrate 202 that is formed directly under the patterned vertical stack 207 may be referred to as a mesa structure 202T. An exemplary lithography process includes spin-on coating a photoresist layer, soft baking of the photoresist layer, mask aligning, exposing, post-exposure baking, developing the photoresist layer, rinsing, and drying (e.g., hard baking). In some instances, the patterning of the fin-shaped active region 205 may be performed using double-patterning or multi-patterning processes to create patterns having pitches smaller than what is otherwise obtainable using a single, direct photolithography process. The etching process can include dry etching, wet etching, and/or other suitable processes. In the depicted embodiment, the vertical stack 207 of alternating semiconductor layers 206 and 208 may include a number of channel layers 208 interleaved by a number of sacrificial layers 206. Each of the channel layers 208 may be formed of silicon (Si) and each of the sacrificial layers 206 may be formed of silicon germanium (SiGe). The channel layers 208 and the sacrificial layers 206 may be epitaxially deposited on the substrate 202 using molecular beam epitaxy (MBE), vapor-phase epitaxy (VPE), ultra-high vacuum CVD (UHV-CVD), and/or other suitable epitaxial growth processes.

As shown in FIG. 2, the workpiece 200 also includes an isolation feature 204 formed around the fin-shaped active region 205 to isolate the fin-shaped active region 205 from an adjacent fin-shaped active region. In some embodiments, the isolation feature 204 is deposited in trenches that define the fin-shaped active region 205. Such trenches may extend through the channel layers 208 and sacrificial layers 206 and terminate in the substrate 202. The isolation feature 204 may also be referred to as a shallow trench isolation (STI) feature 204. In an exemplary process, a dielectric material for the isolation feature 204 is deposited over the workpiece 200 using CVD, subatmospheric CVD (SACVD), flowable CVD (FCVD), physical vapor deposition (PVD), spin-on coating, and/or other suitable process. Then the deposited dielectric material is planarized and recessed until the fin-shaped active region 205 rises above the isolation feature 204. The dielectric material for the isolation feature 204 may include silicon oxide, silicon oxynitride, fluorine-doped silicate glass (FSG), a low-k dielectric, combinations thereof, and/or other suitable materials.

Still referring to FIGS. 2 and 3, the workpiece 200 also includes dummy gate structures 210 disposed over channel regions 205C of the fin-shaped active region 205. The channel regions 205C and the dummy gate structure 210 also define source/drain regions 205S/D that are not vertically overlapped by the dummy gate structures 210. Each of the channel regions 205C is disposed between two source/drain regions 205S/D along the X direction. Two dummy gate structures 210 are shown in FIG. 2 but the workpiece 200 may include more dummy gate structures 210. In this embodiment, a gate replacement process (or gate-last process) is adopted where the dummy gate structures 210 serve as placeholders for functional gate structures (e.g., gate stacks 242 shown in FIG. 11). Other processes and configurations are possible. The dummy gate structure 210 includes a dummy dielectric layer 211, a dummy gate electrode layer 212 over the dummy dielectric layer 211, and a gate-top hard mask layer 214 over the dummy gate electrode layer 212. The dummy dielectric layer 211 may include silicon oxide. The dummy gate electrode layer 212 may include polysilicon. The gate-top hard mask layer 214 may include silicon oxide layer, silicon nitride, and/or other suitable materials. Suitable deposition process, photolithography and etching process may be employed to form the dummy gate structure 210. As shown in FIG. 3, the workpiece 200 also includes a gate spacer layer 216 disposed along a sidewall of the dummy gate structure 210. In some embodiments, the gate spacer layer 216 may include silicon oxide, silicon oxycarbide, silicon carbonitride, silicon nitride, zirconium oxide, aluminum oxide, or a suitable dielectric material.

Figure 4:
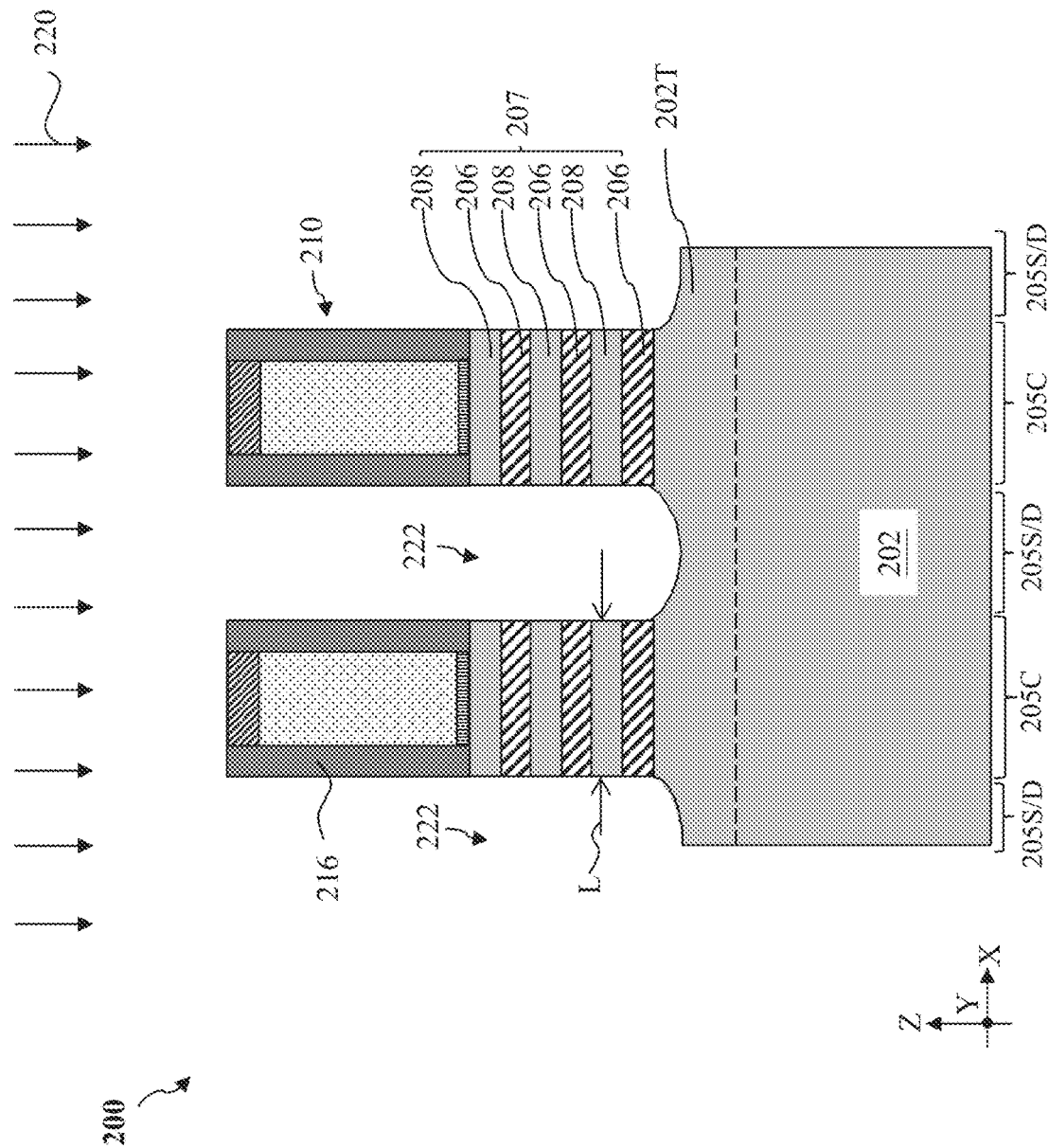

Referring to FIGS. 1 and 4, method 100 includes a block 104 where a first etching process 220 is performed to recess the source/drain regions 205S/D of the fin-shaped active region 205 to form first source/drain openings 222. In some embodiments, the workpiece 200 may be placed in a first process chamber, and the source/drain region 205S/D of the fin-shaped active region 205 that is not covered by the dummy gate structure 210 and the gate spacer layer 216 is anisotropically etched by the first etching process 220 conducted in the first process chamber to form the first source/drain opening 222. The first etching process 220 may be a dry etching process, a wet etching, a combination thereof, or other suitable etching processes. An exemplary dry etching process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Various etching parameters of the first etching process 220 such as etch gas composition, carrier gas composition, etch gas flow rate, carrier gas flow rate, etch time, pressure within the first process chamber, etch temperature, source power, radio frequency (RF) bias voltage, direct current (DC) bias voltage, RF bias power, DC bias power, other suitable etch parameters, or combinations thereof, can be tuned to anisotropically etch the source/drain region 205S/D of the fin-shaped active region 205 to form the first source/drain opening 222. In embodiments represented in FIG. 4, the first source/drain openings 222 extend through vertical stack 207 of channel layers 208 and sacrificial layers 206. The first source/drain openings 222 may partially extend into the mesa structure 202T. As illustrated in FIG. 4, sidewalls of the channel layers 208 and the sacrificial layers 206 and a portion of a top surface of mesa structure 202T are exposed in the first source/drain openings 222. After the performing of the first etching process 220, a length of the channel layers 208 along the X direction is denoted as L.

Figure 5:
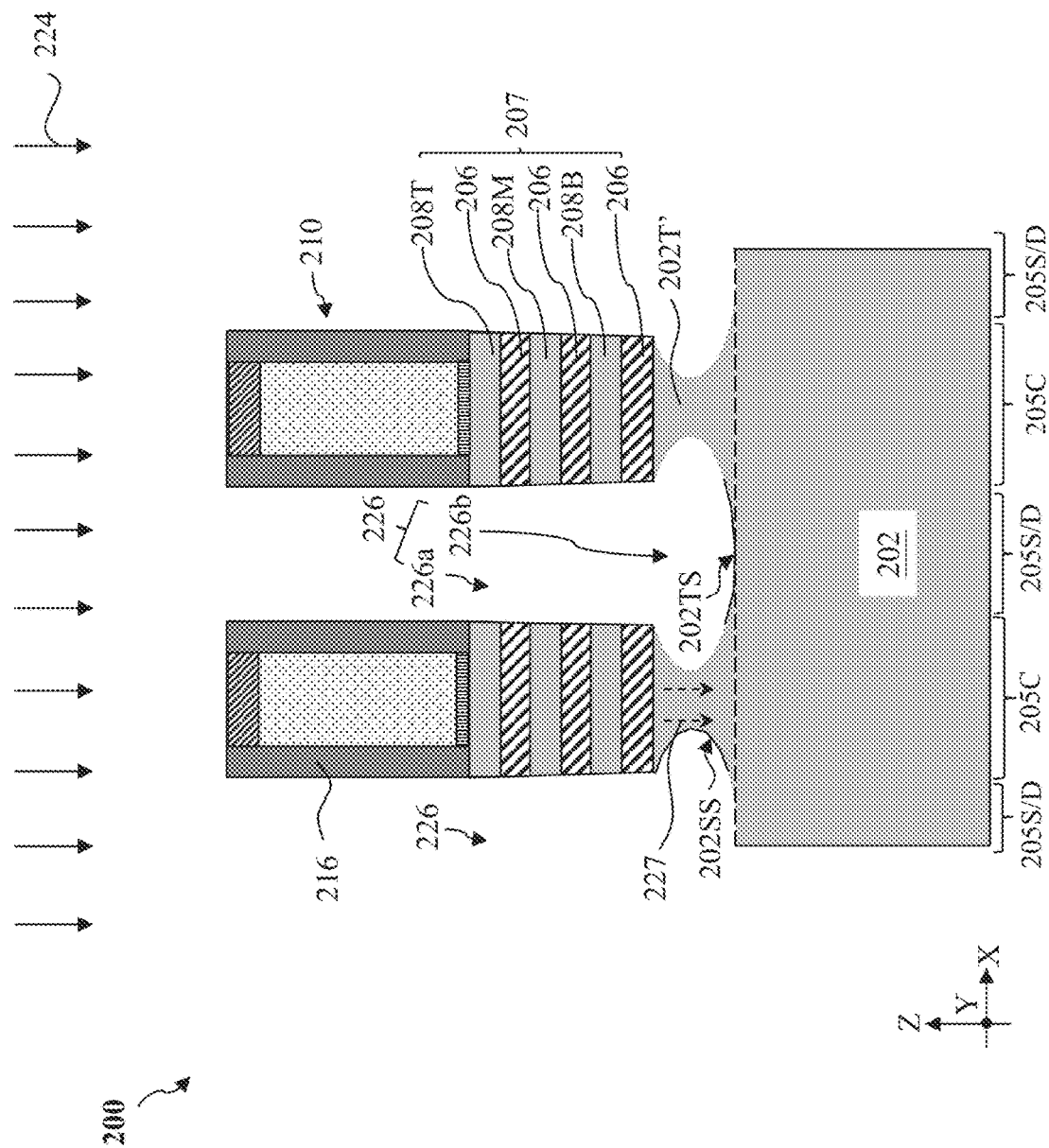

Referring to FIGS. 1 and 5, method 100 includes a block 106 where a second etching process 224 is performed to laterally etch the mesa structure 202T, thereby laterally expanding a bottom portion of the first source/drain opening 222 (at least) along the X direction and forming a second source/drain opening 226. The lateral etching reshapes the profile of the mesa structure 202T under the channel region 205C of the patterned vertical stack 207, reducing its cross-sectional area under the channel region 205C of the patterned vertical stack 207. The reduced cross-sectional area of the mesa structure 202T increases resistance of the current path 227 through the mesa structure 202T into the substrate 202, thereby suppressing the leakage current. The second etching process 224 may be an isotropic dry etching process, an isotropic wet etching process, or a combination thereof. Since the second etching process 224 is an isotropic etching process, the mesa structure 202T may not only be etched along the X direction, but also be etched along the Z direction. The mesa structure 202T after the performing of the second etching process 224 may be referred to as a top portion 202T' or a mesa structure 202T'. In embodiments represented in FIG. 5, the mesa structure 202T' includes a sidewall surface 202SS that is a concave surface and bows or curves inward. The mesa structure 202T' also includes a top surface 202TS that is a concave surface and bows or curves upward. Here, the sidewall surface 202SS of the mesa structure 202T' refers to a portion of the substrate's sidewall surface that is disposed directly under the channel region 205C of the fin-shaped active region 205, and the top surface 202TS of the mesa structure 202T' refers to a portion of the substrate's surface that faces up and is exposed by the second source/drain opening 226.

The second source/drain opening 226 spans a height H (shown in FIG. 6) along the Z direction. In some embodiments, the height H may be between about 50 and about 150 nm. The upper portion of the second source/drain opening 226 that exposes the sidewall surfaces of the channel layers 208 and sacrificial layers 206 may be referred to as a source/drain opening 226a. The lower portion of the second source/drain opening 226 that exposes surfaces of the substrate 202 may be referred to as a source/drain opening 226b. In embodiments represented in FIG. 5, a shape of a cross-sectional view of the second source/drain opening 226 resembles a vase shape, and a shape of a cross-sectional view of the source/drain opening 226b resembles a bowl shape. The source/drain opening 226b spans a width greater than that of the source/drain opening 226a along the X direction.

Figure 6:
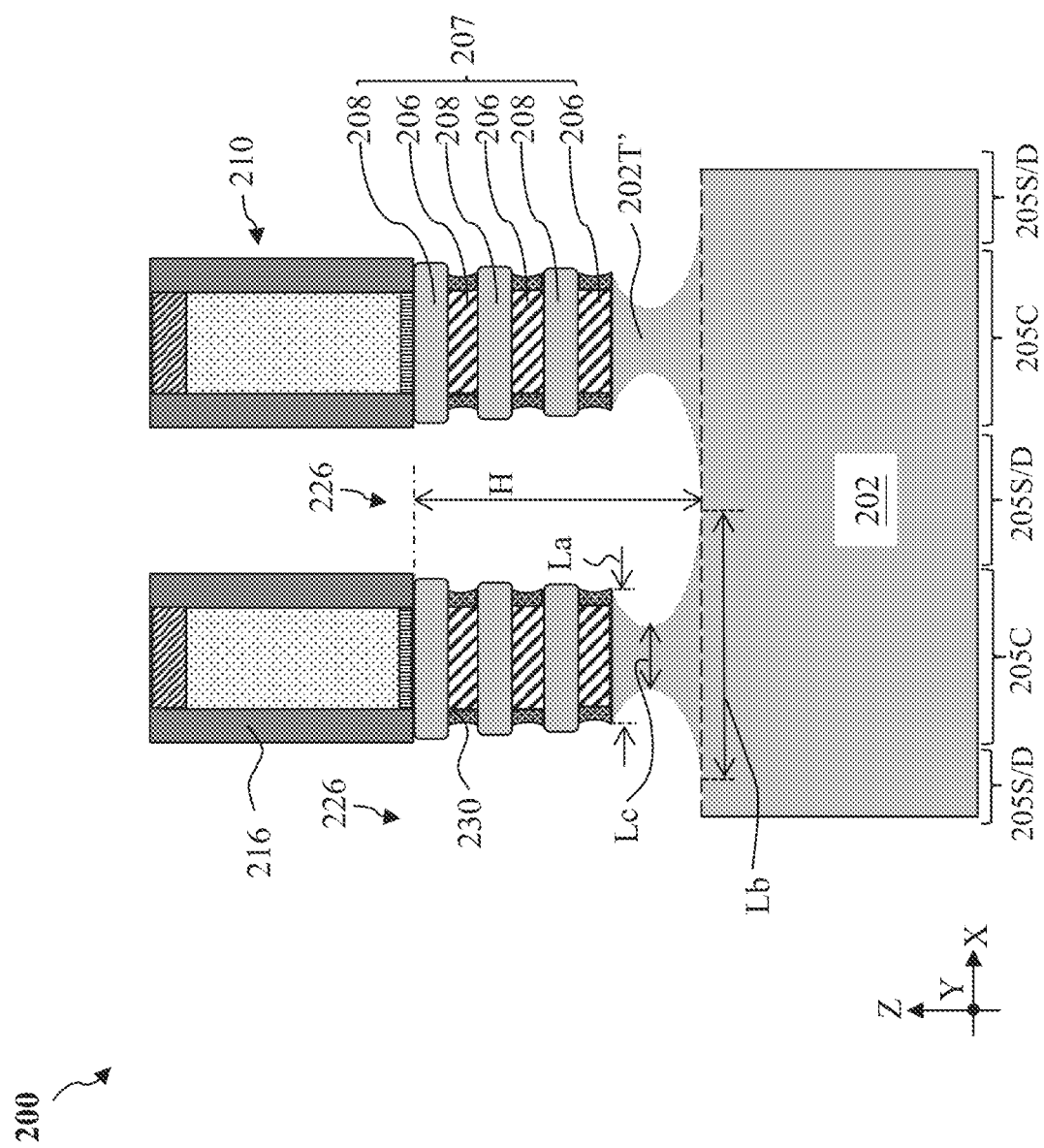

The mesa structure 202T' has a top surface that has a length La (shown in FIG. 6) along the X direction, a bottom surface that has a length Lb (shown in FIG. 6) along the X direction, and a length of the shortest portion of the mesa structure 202T' along the X direction is referred to as Lc (shown in FIG. 6). In some embodiments, the length La is greater than the length Lc and is smaller than the length L (shown in FIG. 4). That is, Lb>La>Lc. A ratio of the length Lc to the length La may be between greater than 0.5 and smaller than 1. In an embodiment, a ratio of the length Lc to the length L may be between about 0.4 and 0.7 such that the volume of the second source/drain opening 226 may be largely increased to significantly reduce the leakage current while not substantially affecting the reliability of the workpiece 200. In some embodiments, the length Lb is no less than the length La. That is, Lb≥La. A ratio of the length Lb to the length La may be between about 1 and 1.5. In an embodiment, the length La may be between about 8 nm and about 200 nm to facilitate the reduction of the cross-sectional area of the mesa structure 202T while providing sufficient support to the semiconductor layers 206 and 208 thereon.

The second etching process 224 is configured to isotopically and partially etch the mesa structure 202T and may include an isotropic dry etching process, an isotropic wet etching, a combination thereof, or other suitable etching processes performed in a second process chamber. In an embodiment, the second etching process 224 is an isotropic dry etching process. One or more etching parameters (e.g., etch gas flow rate and/or pressure within the second process chamber) of the second etching process 224 may be tuned such that the etch gas of the second etching process 224 may stay a little bit longer at the bottom portion of the first source/drain opening 222 than that at the upper portion of the first source/drain opening 222, and one or more etching parameters (e.g., bias voltage and/or pressure within the second process chamber) of the second etching process 224 may be further tuned such that the second etching process 224 etches the mesa structure 202T in a substantially isotropic way, thereby forming the profile of the second source/drain openings 226 and the profile of the mesa structure 202T'. That is, the etch gas flow rate of the second etching process 224, the pressure within the second process chamber, and/or the bias voltage of the second etching process 224 are different from those of the first etching process 220. In an embodiment, the bias voltage associated with the second etching process 224 is different from (e.g., greater than) the bias voltage associated with the first etching process 220, the pressure within the second process chamber is substantially similar to than the pressure within the first process chamber, and/or the etch gas flow rate associated with the second etching process 224 is smaller than the etch gas flow rate associated with the first etching process 220.

In an embodiment, the second etching process 224 may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., $HBr$ and/or $CHBr_3$), an iodine-containing gas, other suitable gases and/or plasmas, and/or combinations thereof. That is, an etchant of the second etching process 224 may be the same as the that of the first etching process 220. In such situation, the first etching process 220 and the second etching process 224 may be performed in a same process chamber.

In embodiments where both the substrate 202 and the channel layers 208 are formed of the same material (e.g., silicon), the second etching process 224 may not only etch the mesa structure 202T, but also slightly recess the channel layers 208 in the X direction. In an embodiment, the channel layers 208 includes a topmost channel layer 208T, a middle channel layer 208M, and a bottommost channel layer 208B, and due to the tuning of the etching parameters of the second etching process 224, the bottommost channel layer 208B may be etched more than the topmost channel layer 208T. That is, after the second etching process 224, a length of the bottommost channel layer 208B may be smaller than that of the middle channel layer 208M, and the length of the middle channel layer 208M may be smaller than that of the topmost channel layer 208T. Due to the length reduction of the channel layers 208, a volume of the second source/drain opening 226a may be greater than a volume of the first source/drain opening 222. In some implementations, the second etching process 224 may also slightly etch the sacrificial layers 206, and after the performing of the second etching process 224, the length relationships among the sacrificial layers 206 may be in a way similar to the length relationships among the channel layers 208. In some other embodiments, a mask film may be formed to extend along the sidewalls of the channel layers 208 and sacrificial layers 206 while the top surface of the mesa structure 202T is exposed, and the second etching process may be then performed to laterally expand the bottom portion of the first source/drain opening 222 to form the second source/drain opening 226 without substantially etching the channel layers 208.

Referring to FIGS. 1 and 6, method 100 includes a block 108 where inner spacer features 230 are formed. Due to the formation of the second source/drain openings 226, the sacrificial layers 206 are exposed in the second source/drain openings 226. The sacrificial layers 206 are then selectively and partially recessed to form inner spacer recesses (at least partially filled by the inner spacer features 230), while the exposed channel layers 208 are significantly unetched. In an embodiment where the channel layers 208 consist essentially of silicon (Si) and the sacrificial layers 206 consist essentially of silicon germanium (SiGe), the selective and partial recess of the sacrificial layers 206 may include use of a selective isotropic etching process (e.g., a selective dry etching process or a selective wet etching process), and the extent at which the sacrificial layers 206 are recessed is controlled by duration of the etching process. After the formation of the inner spacer recesses, an inner spacer material layer is deposited over the workpiece 200, including in the inner spacer recesses. The inner spacer material layer may include silicon oxide, silicon nitride, silicon oxycarbide, silicon oxycarbonitride, silicon carbonitride, metal nitride, or a suitable dielectric material. The deposited inner spacer material layer is then etched back to remove excess inner spacer material layer over sidewalls of the channel layers 208, thereby forming the inner spacer features 230 as shown in FIG. 6.

Figure 7:
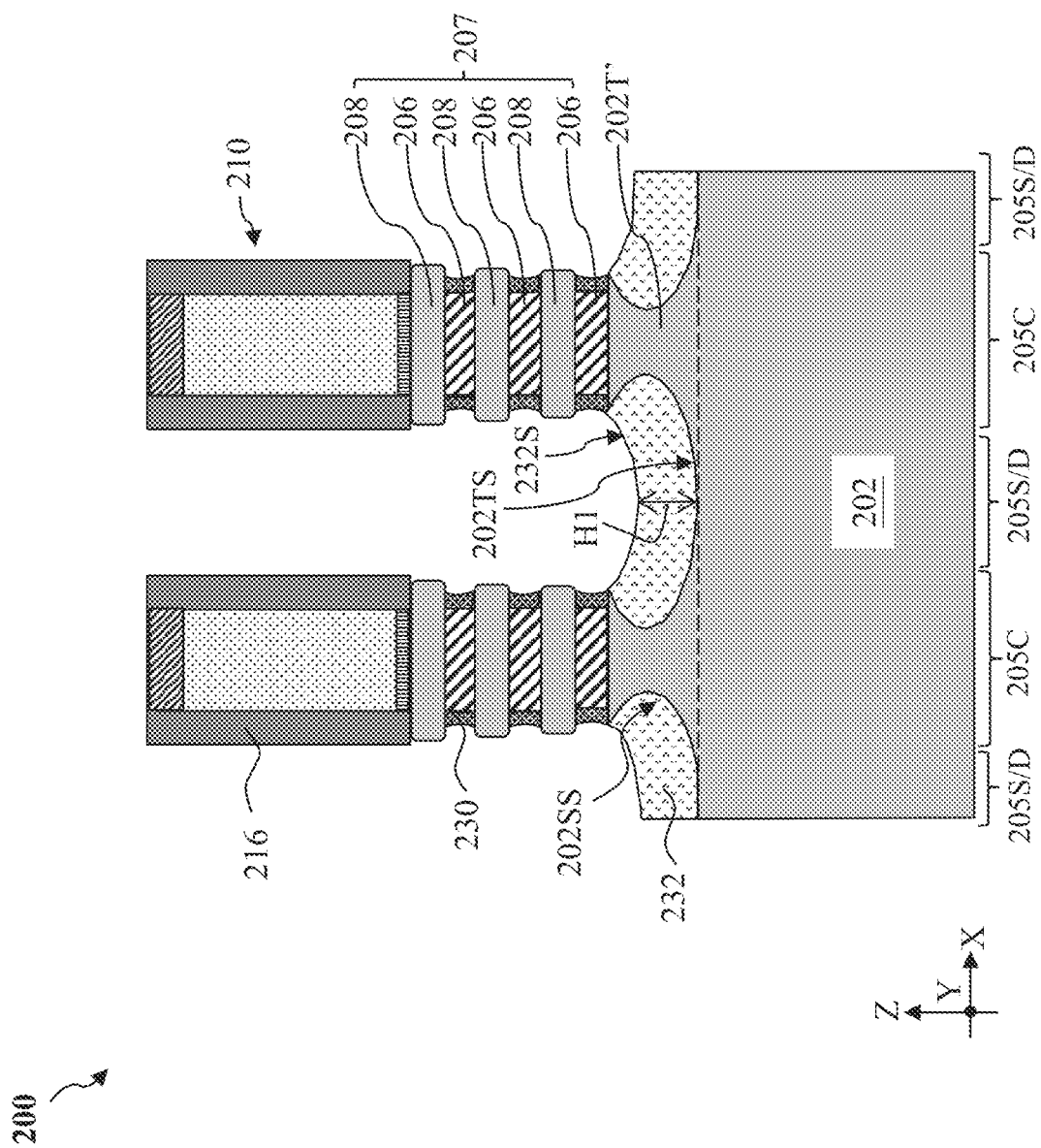
Figure 8:
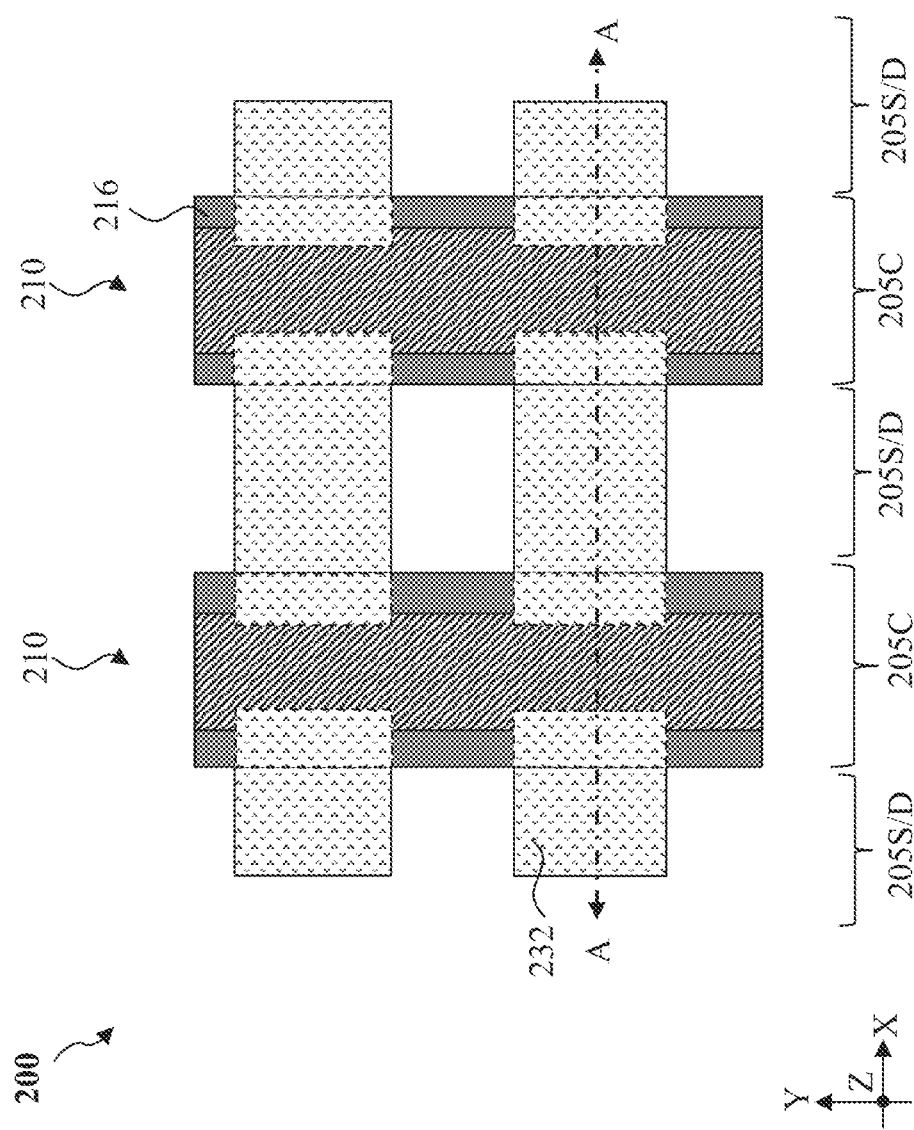
FIGS. 8 and 12 depict fragmentary top views of the workpiece shown in FIG. 7 and FIG. 11, respectively, according to various aspects of the present disclosure.

Referring to FIGS. 1, 7, 8, method 100 includes a block 110 where a first epitaxial layer 232 is formed to substantially fill the bottom portion of the second source/drain opening 226. The first epitaxial layer 232 is an undoped or unintentionally doped (UID) epitaxial layer that is substantially free of dopants. The first epitaxial layer 232 includes undoped silicon, undoped germanium, undoped silicon germanium, undoped silicon carbide, other suitable semiconductor materials, or combinations thereof. In the depicted embodiment, the first epitaxial layer 232 includes silicon that is substantially free of n-type dopants and p-type dopants or silicon germanium that is substantially free of n-type dopants and p-type dopants. The first epitaxial layer 232 fills the bottom portion of the second source/drain opening 226 and tracks the shape of the bottom portion of the second source/drain opening 226. That is, the first epitaxial layer 232 physically contacts the mesa structure 202T' and the substrate 202. The first epitaxial layer 232 includes a bottom surface that is in direct contact with the top surface 202TS and a sidewall surface that is in direct contact with the sidewall surface 202SS. In this depicted example, a top surface 232S of the first epitaxial layer 232 is also a concave surface and curves upward. A shape of a cross-sectional view of the first epitaxial layer 232 may resemble a bowl shape. In some embodiments, the first epitaxial layer 232 may also be in direct contact with a lower portion of the sidewall of the inner spacer feature 230. As shown in FIG. 7, a part of the first epitaxial layer 232 underlies the patterned vertical stack 207. More specifically, a part of the first epitaxial layer 232 is disposed directly under the gate spacer layer 216, and even directly under the dummy gate structure 210. FIG. 8 depicts a fragmentary top view of the workpiece 200 after the formation of the first epitaxial layer 232. In embodiments represented in FIG. 8, a portion of the first epitaxial layer 232 is disposed directly under the dummy gate structure 210. It is noted that, features such as isolation structures (e.g., STIs 204) are omitted in FIG. 8 for reason of simplicity.

Still referring to FIG. 7, the first epitaxial layer 232 has a height H1 along the Z direction, where height H1 is between the lowest point of the top surface 232S of the first epitaxial layer 232 and the lowest point of the top surface 202TS of the mesa structure 202T'. In some embodiments, the lowest point of the top surface 202TS may extend into the substrate 202 under the mesa structure 202T'. A ratio of the height H1 to the height H (shown in FIG. 6) is controlled to maximize a volume of the first epitaxial layer 232 below the top surface of the mesa structure 202T' while maximizing a volume of subsequently formed doped epitaxial layers (i.e., the second epitaxial layer 234 and/or the third epitaxial layer 236) of the epitaxial source/drain feature above the top surface of the mesa structure 202T'. In some embodiments, the ratio of height H1 to the height H (i.e., H1/H) may be between about 0.1 and about 0.3.

In some embodiments, the first epitaxial layer 232 is formed using a cyclic deposition etch (CDE) process, which is a sequence of deposition processes and etch processes configured to alternately deposit and etch a semiconductor material. Each cycle of the CDE process includes a deposition process and an etching process, where the CDE process implements multiple cycles to form the first epitaxial layer 232. In some implementations, the deposition process is a chemical vapor deposition (CVD) process configured to epitaxially grow a semiconductor material, such as silicon, from the top and sidewall surfaces (i.e., 202TS and 202SS) of the mesa structure 202T' and/or the substrate 202.

Figure 9:
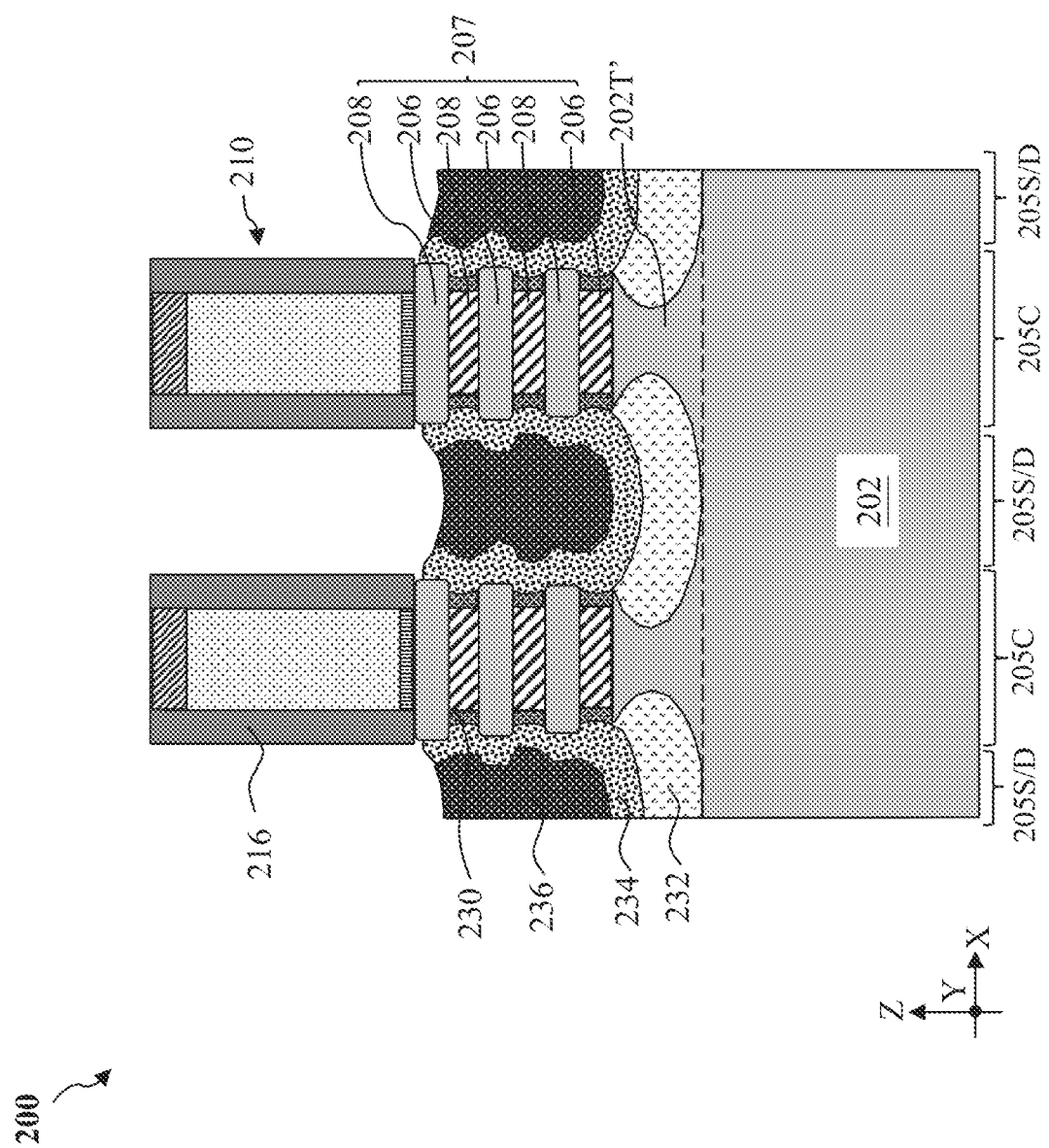

Referring to FIGS. 1 and 9, method 100 includes a block 112 where a second epitaxial layer 234 is formed in the second source/drain opening 226 and over the first epitaxial layer 232. The second epitaxial layer 234 may be selectively grown from semiconductor surfaces exposed in the second source/drain opening 226 by using an epitaxial process, such as VPE, UHV-CVD, MBE, and/or other suitable processes. The epitaxial process may use gaseous and/or liquid precursors, which interact with the composition of the first epitaxial layer 232 and/or the channel layers 208. In the present embodiments, the second epitaxial layer 234 is formed over sidewalls of the channel layers 208 and a top surface of the first epitaxial layer 232 exposed in the second source/drain openings 226 as illustrated in FIG. 9, thereby partially filling the second source/drain openings 226. Portions of the second epitaxial layer 234 grown from sidewalls of the channel layers 208 merge, thus the second epitaxial layer 234 may be substantially in direct contact with the inner spacer features 230. In some other implementations, the second epitaxial layer 234 may be a discontinuous layer that include a bottom segment on the first epitaxial layer 232 and multiple sidewall segments on the sidewall surfaces of the channel layers 208. That is, the second epitaxial layer 234 may be not in direct contact with the inner spacer features 230.

A composition of the second epitaxial layer 234 is different than a composition of the first epitaxial layer 232. More specifically, in embodiments where the workpiece 200 includes n-type transistors, the second epitaxial layer 234 may include arsenic-doped silicon (Si:As), phosphorus-doped silicon (Si:P), or other suitable materials, and have a first dopant concentration greater than that of the undoped first epitaxial layer 232. In embodiments where the workpiece 200 includes p-type transistors, the second epitaxial layer 234 may include boron-doped silicon germanium (SiGe:B), boron-doped silicon carbide (SiC:B), or other suitable materials, and have a first dopant concentration greater than that of the undoped first epitaxial layer 232.

Still referring to FIGS. 1 and 9, method 100 includes a block 114 where a third epitaxial layer 236 is formed to substantially fill the second source/drain opening 226. The third epitaxial layer 236 may be formed over the first and the second epitaxial layers 232 and 234 by using an epitaxial process, such as VPE, UHV-CVD, MBE, and/or other suitable processes. The epitaxial process may use gaseous and/or liquid precursors, which interact with the composition of the first epitaxial layer 232 and/or the second epitaxial layers 234. The third epitaxial layer 236 is therefore coupled to the channel layers 208 in the channel regions 205C of the fin-shape active region 205. In embodiments represented in FIG. 9, the third epitaxial layer 236 is separated from the channel layers 208 and the inner spacer features 230 by a sidewall epitaxial portion of the second epitaxial layer 234 and is separated from the first epitaxial layer 232 a by bottom epitaxial portion of the second epitaxial layer 234.

Depending on the conductivity type of the to-be-formed transistor, the third epitaxial layer 236 may be an n-type feature or a p-type feature. A composition of the third epitaxial layer 236 may be the same as or different than a composition of the second epitaxial layer 234, and a dopant concentration of the third epitaxial layer 236 is greater than that of the second epitaxial layer 234. More specifically, in embodiments where the workpiece 200 includes n-type transistors, the third epitaxial layer 236 may include arsenic-doped silicon (Si:As), phosphorus-doped silicon (Si:P), or other suitable materials, and have a second dopant concentration greater than the first dopant concentration. In an embodiment, the second epitaxial layer 234 is formed of arsenic-doped silicon (Si:As), and the third epitaxial layer 236 is formed of phosphorus-doped silicon (Si:P). In embodiments where the workpiece 200 includes p-type transistors, the third epitaxial layer 236 may include boron-doped silicon germanium (SiGe:B), boron-doped silicon carbide (SiC:B), or other suitable materials, and have a second dopant concentration greater than the first dopant concentration. In some embodiments, one or more of the first epitaxial layer 232, the second epitaxial layer 234, and the third epitaxial layer 236 may be separately or collectively referred to as a source/drain feature.

Figure 10:
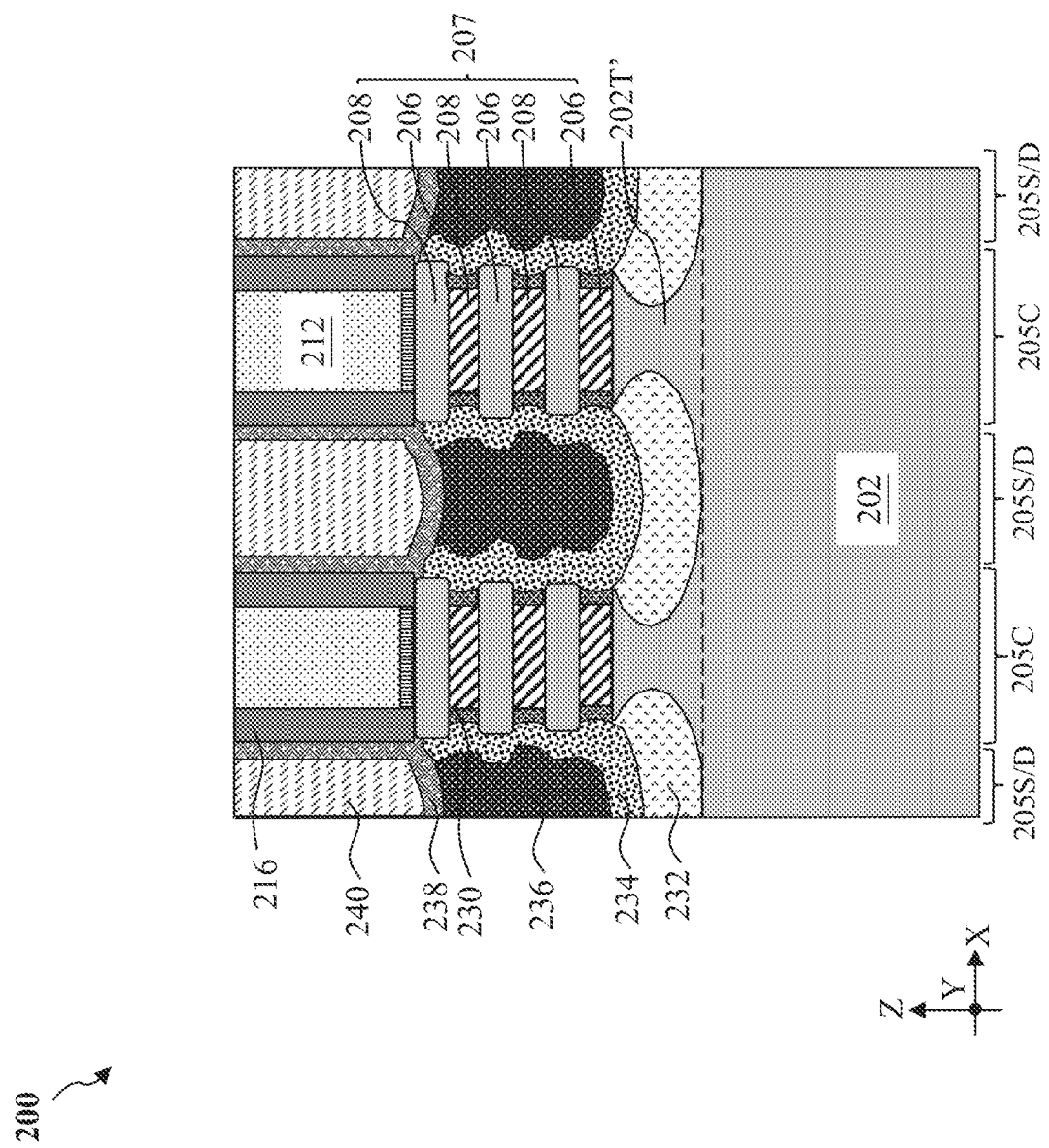

Referring to FIGS. 1 and 10, method 100 includes a block 116 where a contact etch stop layer (CESL) 238 and an interlayer dielectric (ILD) layer 240 are deposited over the workpiece 200. The CESL 238 may be conformally deposited over the workpiece 200 and may include silicon nitride, silicon oxynitride, and/or other materials known in the art and may be formed by ALD, plasma-enhanced chemical vapor deposition (PECVD) process and/or other suitable deposition or oxidation processes. The ILD layer 240 is deposited by a PECVD process or other suitable deposition technique over the workpiece 200 after the deposition of the CESL 238. The ILD layer 240 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. A planarization process, such a chemical mechanical polishing (CMP) process may be then performed to the workpiece 200 to remove excess materials and expose top surfaces of the dummy gate electrode layer 212 in the dummy gate structures 210. After the planarization process, as shown in FIG. 10, the CESL 238 is disposed on top surfaces of the second and third epitaxial layers and sidewalls of the gate spacer layer 216.

Figure 11:
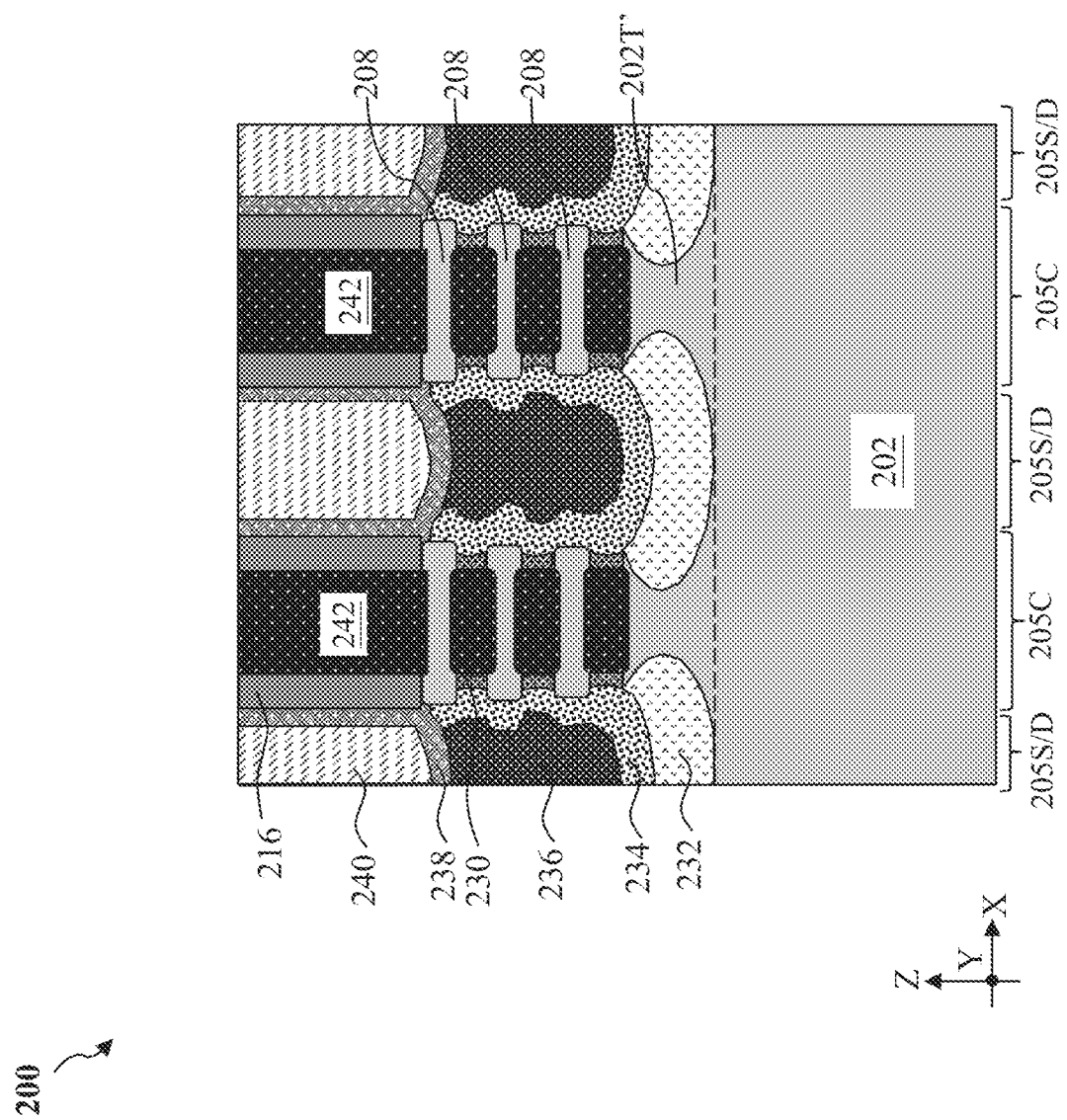

Referring to FIGS. 1 and 11, method 100 includes a block 118 where the dummy gate structures 210 are replaced with the gate stacks 242. With the exposure of the dummy gate electrode layer 212, block 118 proceeds to removal of the dummy gate structures 210. The removal of the dummy gate structures 210 may include one or more etching process that are selective to the materials in the dummy gate structures 210. For example, the removal of the dummy gate structures 210 may be performed using a selective wet etch, a selective dry etch, or a combination thereof. After the removal of the dummy gate structures 210, the sacrificial layers 206 are selectively removed to release the channel layers 208 as channel members 208 in the channel regions 205C. The selective removal of the sacrificial layers 206 may be implemented by a selective dry etch, a selective wet etch, or other selective etch process. In some embodiments, the selective wet etch includes an APM etch (e.g., ammonia hydroxide-hydrogen peroxide-water mixture).

The gate stacks 242 are then deposited to wrap over the channel members 208. Each of the gate stacks 242 includes a gate dielectric layer (not separately labeled) and a gate electrode layer (not separately labeled) over the gate dielectric layer. In some embodiments, the gate dielectric layer includes an interfacial layer disposed on the channel members 208 and a high-k dielectric layer over the interfacial layer. Here, a high-k dielectric layer refers to a dielectric material having a dielectric constant greater than that of silicon dioxide, which is about 3.9. A low-k dielectric layer refers to a dielectric material having a dielectric constant no greater than that of silicon dioxide. In some embodiments, the interfacial layer may be formed by thermal oxidation and may include silicon oxide. The high-k dielectric layer is then deposited over the interfacial layer using ALD, CVD, and/or other suitable methods. The high-k dielectric layer may include hafnium oxide. Alternatively, the high-k dielectric layer may include other high-k dielectrics, such as titanium oxide, hafnium zirconium oxide, tantalum oxide, hafnium silicon oxide, zirconium silicon oxide, lanthanum oxide, aluminum oxide, yttrium oxide, $SrTiO_3$, $BaTiO_3$, BaZrO, hafnium lanthanum oxide, lanthanum silicon oxide, aluminum silicon oxide, hafnium tantalum oxide, hafnium titanium oxide, $(Ba,Sr)TiO_3$ (BST), silicon nitride, silicon oxynitride, combinations thereof, or other suitable material.

Figure 12:
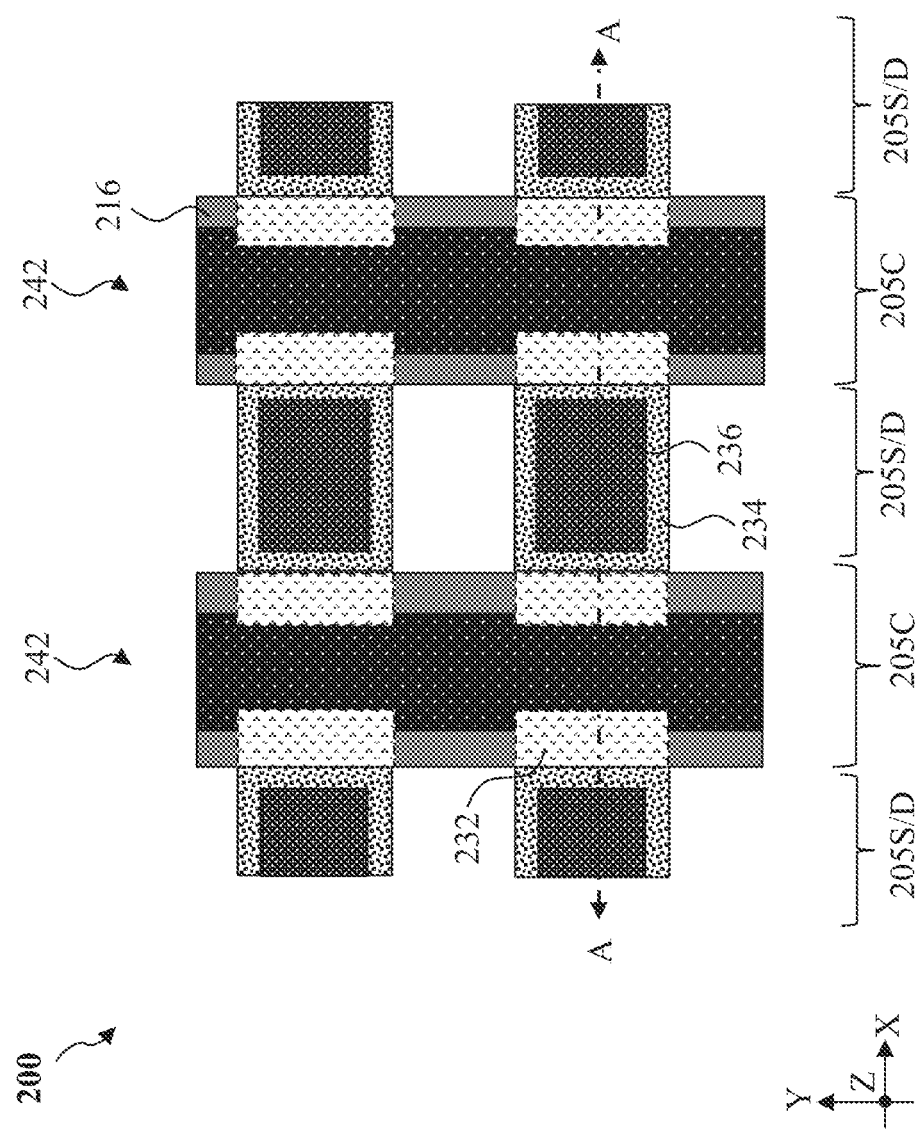

The gate electrode layer is then deposited over the gate dielectric layer using ALD, PVD, CVD, e-beam evaporation, or other suitable methods. The gate electrode layer may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride, titanium aluminum, titanium aluminum nitride, tantalum nitride, tantalum aluminum, tantalum aluminum nitride, tantalum aluminum carbide, tantalum carbonitride, aluminum, tungsten, nickel, titanium, ruthenium, cobalt, platinum, tantalum carbide, tantalum silicon nitride, copper, other refractory metals, or other suitable metal materials or a combination thereof. Further, when the semiconductor device 200 includes n-type transistors and p-type transistors, different gate electrode layers may be formed separately for n-type transistors and p-type transistors, which may include different work function metal layers (e.g., for providing different n-type and p-type work function metal layers). In embodiments represented in FIG. 11, the portion of the first epitaxial layer 232 is spaced apart from the gate stack 242 by a portion of the mesa structure 202T'. That is, the first epitaxial layer 232 is not in direct contact with the gate stack 242. FIG. 12 depicts a fragmentary top view of the workpiece 200 after the formation of the gate stacks 242. As shown in FIG. 12, a portion of the first epitaxial layer 232 (shown in dashed lines) is disposed directly under the gate stack 242.

Figure 13:
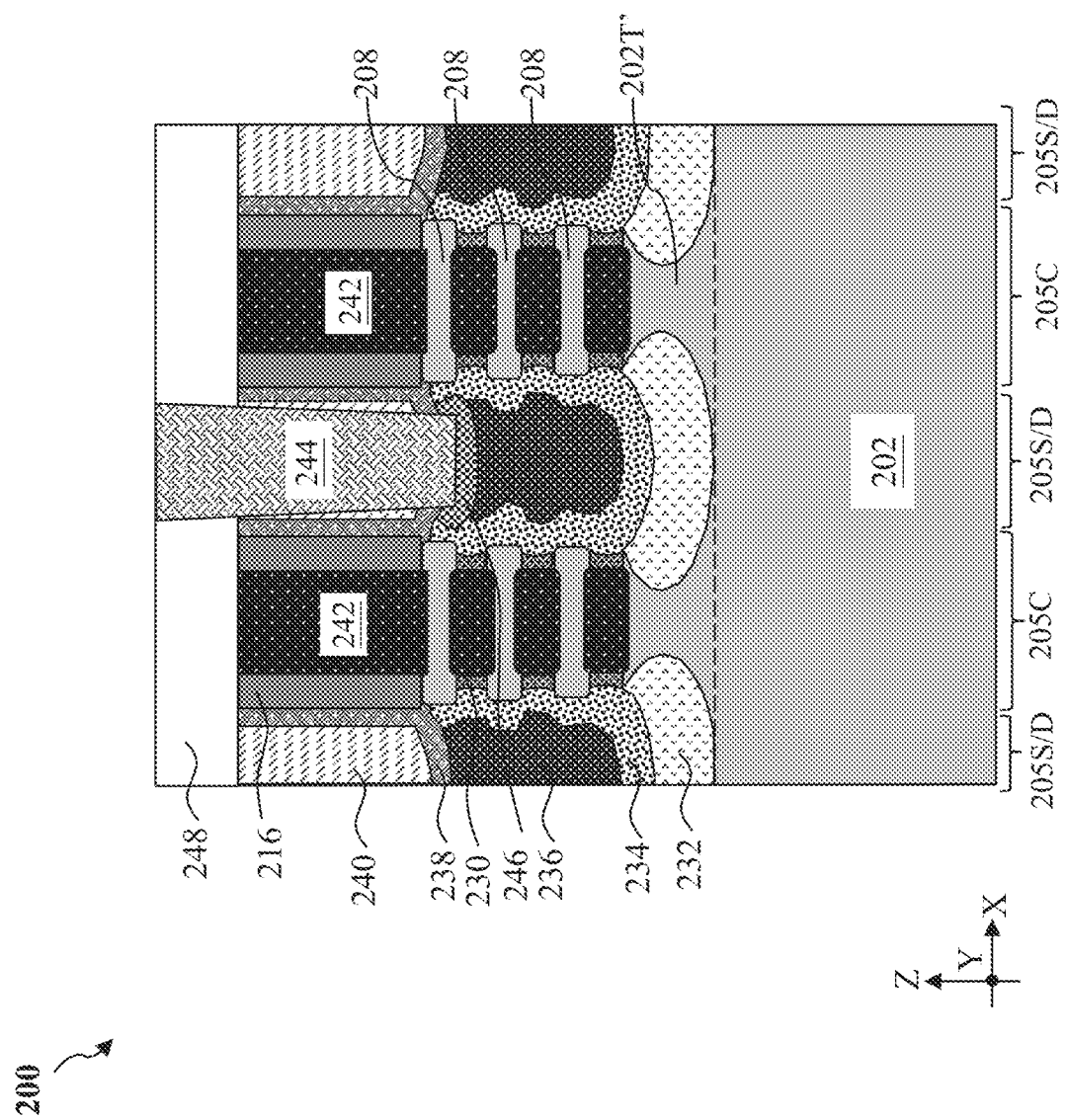
Figure 14:
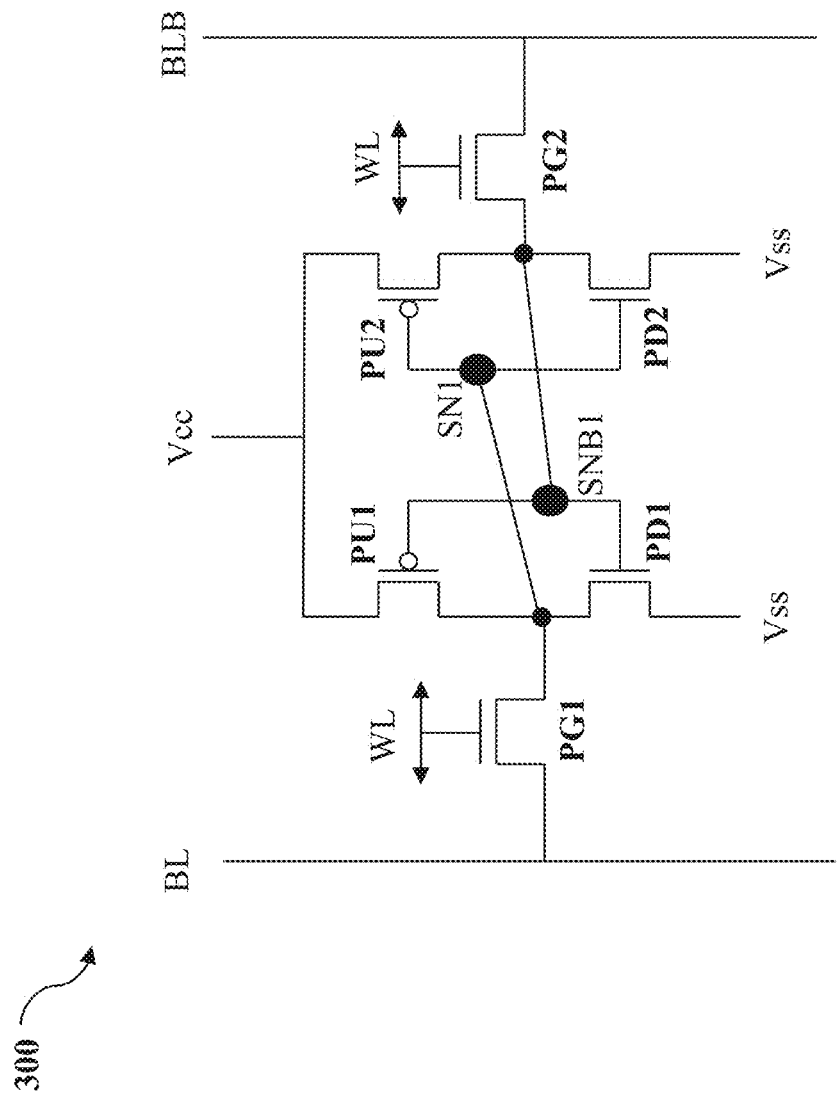
FIG. 14 illustrates a circuit schematic of an exemplary SRAM cell according to various aspects of the present disclosure.

Referring to FIGS. 1 and 13, method 100 includes a block 120 where further processes are performed to finish the fabrication of the workpiece 200. Such further processes may include forming an ILD layer 248 over the workpiece 200, patterning the ILD layer 248, the CESL 238, and the ILD layer 240 to form a source/drain contact opening exposing at least a portion of the top surface of the source/drain feature, forming a silicide layer 246 on the exposed surface of the source/drain feature, and forming a source/drain contact 244 to fill the source/drain contact opening. The ILD layer 248 may be in a way similar to the ILD layer 240. The silicide layer 246 includes nickel silicide or other suitable materials. In embodiments represented in FIG. 13, the silicide layer 246 is in direct contact with both the second epitaxial layer 234 and the third epitaxial layer 236. Such further processes may also include forming other device-level contacts, such as gate contact vias (e.g., not shown) formed over the gate stacks 242. Such further processes may also include forming a multi-layer interconnect (MLI) structure (not depicted) over the workpiece 200. In some embodiments, the MLI structure may include multiple intermetal dielectric (IMD) layers and multiple metal lines or contact vias in each of the IMD layers. In some instances, the IMD layers and the ILD layer 240 may share similar composition. The metal lines and contact vias in each IMD layer may be formed of metal, such as aluminum, tungsten, ruthenium, or copper. In some embodiments, the metal lines and contact vias may be lined by a barrier layer to insulate the metal lines and contact vias from the IMD layers.

The workpiece 200 may be implemented in a variety of IC applications, including memory devices such as Static Random-Access Memory (SRAM) devices. In that regard, FIG. 14 illustrates an exemplary circuit schematic for a single-port SRAM cell (e.g., 1-bit SRAM cell) 300. The single-port SRAM cell 300 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. Since the SRAM cell 300 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node SN1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 300 may be implemented using "planar" transistor devices, with FinFET devices, and/or with GAA devices.

Embodiments of the present disclosure provide advantages. Methods of the present disclosure form multi-gate device with channel layers suspended above a mesa structure that has concave sidewalls. Such sidewall profile increases resistance along current path through a mesa structure into a substrate. Accordingly, this provides a benefit of substrate leakage current suppression and reduced power consumption. Furthermore, the multi-gate device flow with adjusted mesa sidewall profile can be easily integrated into existing semiconductor fabrication processes.

The present disclosure provides for many different embodiments. Semiconductor structures and methods of fabrication thereof are disclosed herein. In one exemplary aspect, the present disclosure is directed to a semiconductor device. The semiconductor device includes a vertical stack of channel members disposed over a substrate, a gate structure wrapping around each channel member of the vertical stack of channel members, and a source/drain feature disposed over the substrate and coupled to the vertical stack of channel members, the source/drain feature comprising an undoped bottom layer and a doped upper layer. A part of the undoped bottom layer of the source/drain feature is disposed directly under the gate structure.

In some embodiments, the semiconductor device may also include a dielectric inner spacer feature. The vertical stack of channel members may include a first channel member disposed directly over a second channel member and spaced apart from the second channel member by the dielectric inner spacer feature. In some embodiments, a length of the first channel member may be greater than a length of the second channel member. In some embodiments, the doped upper layer of the source/drain feature may be spaced apart from the gate structure by the dielectric inner spacer feature. In some embodiments, the doped upper layer may be a first doped upper layer, the source/drain feature further may include a second doped upper layer embedded in the first doped upper layer, and the second doped upper layer may be spaced apart from the undoped bottom layer by the first doped upper layer. In some embodiments, the undoped bottom layer of the source/drain feature may include a sidewall surface that curves outward. In some embodiments, the undoped bottom layer of the source/drain feature may include a top surface that curves upward. In some embodiments, in a cross-sectional view defined by a horizontal axis and a vertical axis, a bottommost portion of the gate structure may be disposed over a portion of the substrate, and the portion of the substrate may have an hourglass shape in the cross-sectional view.

In another exemplary aspect, the present disclosure is directed to a semiconductor device. The semiconductor device includes a semiconductor mesa region protruding from a substrate and comprising a first portion and a second portion, a plurality of channel members disposed directly over the first portion of the semiconductor mesa region, a gate structure wrapping around the plurality of channel members, and a source/drain feature disposed in and over the second portion of the semiconductor mesa region and adjacent to the plurality of channel members along a first direction, where a shape of a cross-sectional view of the first portion of the semiconductor mesa region may include substantially an hourglass shape.

In some embodiments, in the cross-sectional view, the first portion of the semiconductor mesa region may include a top surface having a first width along the first direction and a bottom surface having a second width along the first direction, the second width may be greater than the first width. In some embodiments, the source/drain feature may include an upper portion laterally adjacent to the plurality of channel members and a lower portion laterally adjacent to the first portion of the of the semiconductor mesa region, and a width of the lower portion along the first direction may be greater than a width of the upper portion. In some embodiments, the lower portion may be formed of an undoped semiconductor layer. In some embodiments, the gate structure may include a top portion and a bottom portion disposed below the top portion, the bottom portion of the gate structure may be interleaved with the plurality of channel members, and a part of the undoped semiconductor layer may be disposed directly under the bottom portion of the gate structure. In some embodiments, the plurality of channel members may include a topmost channel member, a bottommost channel member, and a middle channel member disposed vertically between the topmost channel member and the bottommost channel member, and, along the first direction, a length of the topmost channel member may be greater than a length of the bottommost channel member.

In yet another exemplary aspect, the present disclosure is directed to a method. The method includes receiving a workpiece comprising a fin-shaped active region extending from a substrate, the fin-shaped active region comprising a channel region and a source/drain region disposed laterally adjacent to the channel region, forming a dummy gate structure over the channel region, performing a first etching process to recess the source/drain region to form a first source/drain opening, performing a second etching process to laterally extend a bottom portion of the first source/drain opening, thereby forming a second source/drain opening, forming an undoped first semiconductor layer in the second source/drain opening, forming a second semiconductor layer in the second source/drain opening and over the undoped first semiconductor layer, forming a third semiconductor layer to fill the second source/drain opening, and replacing the dummy gate structure with a metal gate stack, where a portion of the undoped first semiconductor layer is disposed directly under the metal gate stack.

In some embodiments, the performing of the first etching process may include performing an anisotropic dry etching process. In some embodiments, the performing of the first etching process may include implementing a fluorine-containing gas, a chlorine-containing gas, a bromine-containing gas, an oxygen-containing gas, or an iodine-containing gas. In some embodiments, the performing of the second etching process may include performing an isotropic dry etching process. In some embodiments, an etchant of the first etching process may be the same as an etchant of the second etching process, the first etching process and the second etching process are performed in a same process chamber, and a bias voltage associated with the first etching process may be different than a bias voltage associated with the second etching process. In some embodiments, the fin-shaped active region may include a stack of sacrificial semiconductor layers and channel layers alternately arranged one over another, and a composition of the sacrificial semiconductor layers is different than a composition of the channel layers. The replacing of the dummy gate structure with the metal gate stack may include selectively removing the dummy gate structure, selectively removing the sacrificial semiconductor layers, and forming the metal gate stack over the workpiece to wrap around each of the channel layers.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a vertical stack of channel members disposed over a substrate;
a gate structure wrapping around each channel member of the vertical stack of channel members; and
a source/drain feature disposed over the substrate and coupled to the vertical stack of channel members, the source/drain feature comprising an undoped bottom layer and a doped upper layer,
wherein a part of the undoped bottom layer of the source/drain feature is disposed directly under the gate structure.

2. The semiconductor device of claim 1, further comprising:
a dielectric inner spacer feature,
wherein the vertical stack of channel members comprises a first channel member disposed directly over a second channel member and spaced apart from the second channel member by the dielectric inner spacer feature.

3. The semiconductor device of claim 2, wherein a length of the first channel member is greater than a length of the second channel member.

4. The semiconductor device of claim 2, wherein the doped upper layer of the source/drain feature is spaced apart from the gate structure by the dielectric inner spacer feature.

5. The semiconductor device of claim 1, wherein the doped upper layer is a first doped upper layer, the source/drain feature further comprises a second doped upper layer embedded in the first doped upper layer, and the second doped upper layer is spaced apart from the undoped bottom layer by the first doped upper layer.

6. The semiconductor device of claim 1, wherein the undoped bottom layer of the source/drain feature comprises a sidewall surface that curves outward.

7. The semiconductor device of claim 1, wherein the undoped bottom layer of the source/drain feature comprises a top surface that curves upward.

8. The semiconductor device of claim 1,
wherein in a cross-sectional view defined by a horizontal axis and a vertical axis, a bottommost portion of the gate structure is disposed over a portion of the substrate, and the portion of the substrate has an hourglass shape in the cross-sectional view.

9. A semiconductor device, comprising:
a semiconductor mesa region protruding from a substrate and comprising a first portion and a second portion;
a plurality of channel members disposed directly over the first portion of the semiconductor mesa region;
a gate structure wrapping around the plurality of channel members; and
a source/drain feature disposed in and over the second portion of the semiconductor mesa region and adjacent to the plurality of channel members along a first direction,
wherein a shape of a cross-sectional view of the first portion of the semiconductor mesa region comprises substantially an hourglass shape.

10. The semiconductor device of claim 9, wherein in the cross-sectional view, the first portion of the semiconductor mesa region comprises a top surface having a first width along the first direction and a bottom surface having a second width along the first direction, the second width is greater than the first width.

11. The semiconductor device of claim 9,
wherein the source/drain feature comprises an upper portion laterally adjacent to the plurality of channel members and a lower portion laterally adjacent to the first portion of the of the semiconductor mesa region, and
wherein, along the first direction, a width of the lower portion is greater than a width of the upper portion.

12. The semiconductor device of claim 11, wherein the lower portion is formed of an undoped semiconductor layer.

13. The semiconductor device of claim 12,
wherein the gate structure comprises a top portion and a bottom portion disposed below the top portion, and wherein the bottom portion of the gate structure is interleaved with the plurality of channel members, and
wherein a part of the undoped semiconductor layer is disposed directly under the bottom portion of the gate structure.

14. The semiconductor device of claim 9,
wherein plurality of channel members comprises a topmost channel member, a bottommost channel member, and a middle channel member disposed vertically between the topmost channel member and the bottommost channel member,
wherein, along the first direction, a length of the topmost channel member is greater than a length of the bottommost channel member.

15. A semiconductor device, comprising:
a plurality of nanostructures over a substrate;

a gate structure wrapping around and over the plurality of nanostructures, wherein a portion of the gate structure is disposed under a bottommost nanostructure of the plurality of nanostructures; and a source/drain feature adjacent and coupled to the plurality of nanostructures, wherein the source/drain feature comprises a lower portion embedded in the substrate and an upper portion over the substrate, and wherein the lower portion spans a first width, the upper portion spans a second width less than the first width, wherein the lower portion of the source/drain feature is vertically overlapped with the portion of the gate structure.

16. The semiconductor device of claim 15, wherein the lower portion of the source/drain feature is disposed laterally adjacent to a portion of the substrate, and the portion of the substrate have a non-uniform width.

17. The semiconductor device of claim 15, wherein a dopant concentration of the lower portion of the source/drain feature is less than a dopant concentration of the upper portion of the source/drain feature.

18. The semiconductor device of claim 15, further comprising:

inner spacer features disposed between the gate structure and the source/drain feature.

19. The semiconductor device of claim 15, wherein the lower portion of the source/drain feature comprises a curved top surface and a curved bottom surface connecting with the curved top surface.

20. The semiconductor device of claim 15, wherein a length of the bottommost nanostructure of the plurality of nanostructures is less than a length of a topmost nanostructure of the plurality of nanostructures.

* * * * *